United States Patent
Rim et al.

(10) Patent No.: US 7,507,614 B2
(45) Date of Patent: Mar. 24, 2009

(54) IMAGE SENSOR APPLIED WITH DEVICE ISOLATION TECHNIQUE FOR REDUCING DARK SIGNALS AND FABRICATION METHOD THEREOF

(75) Inventors: Jae-Young Rim, Ichon-shi (KR); Ho-Soon Ko, Ichon-shi (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 57 days.

(21) Appl. No.: 11/890,991

(22) Filed: Aug. 8, 2007

(65) Prior Publication Data
US 2007/0281437 A1    Dec. 6, 2007

Related U.S. Application Data
(62) Division of application No. 10/882,846, filed on Jun. 30, 2004, now abandoned.

(30) Foreign Application Priority Data
Dec. 16, 2003    (KR)  ............... 10-2003-0091843

(51) Int. Cl.
*H01L 21/84* (2006.01)
(52) U.S. Cl. .............. 438/149; 438/151; 438/156; 257/E21.415; 257/E21.614; 257/E25.021; 257/E27.026; 257/E27.111; 257/E29.273; 257/E29.275
(58) Field of Classification Search .......... 438/149, 438/151, 152, 156; 257/E21.415, 614, E25.021, 257/E27.026, 111, 162, E29.273, 275, 286, 257/295
See application file for complete search history.

(56) References Cited

U.S. PATENT DOCUMENTS

| 5,206,749 | A  | * | 4/1993  | Zavracky et al. ............. 349/45 |
| 5,844,290 | A  | * | 12/1998 | Furumiya |
| 6,245,643 | B1 |   | 6/2001  | King et al. |
| 6,331,873 | B1 | * | 12/2001 | Burke et al. ................ 348/314 |
| 6,563,187 | B1 | * | 5/2003  | Park |
| 2001/0017367 | A1 | * | 8/2001  | Rotstein .................... 256/13.1 |
| 2001/0019851 | A1 | * | 9/2001  | Connolly et al. ............ 438/73 |
| 2001/0055849 | A1 | * | 12/2001 | Pan et al. ................... 438/286 |
| 2002/0197758 | A1 | * | 12/2002 | Chen et al. .................. 438/48 |
| 2003/0169360 | A1 | * | 9/2003  | Rhodes ....................... 348/308 |

(Continued)

FOREIGN PATENT DOCUMENTS

| JP | 11-284168  |   | 10/1999 |
| JP | 11-312731  |   | 11/1999 |
| JP | 11312731 A | * | 11/1999 |

OTHER PUBLICATIONS
Wolf et al., Silicon Processing for the VLSI Era, vol. 1, 2nd Edition, Lattice Press, 2000, pp. 265, 300-301.*

*Primary Examiner*—Michael S Lebentritt
(74) *Attorney, Agent, or Firm*—Blakely, Sokoloff, Taylor & Zafman LLP

(57) ABSTRACT

The present invention relates to an image sensor applied with a device isolation technique for reducing dark signals and a fabrication method thereof. The image sensor includes: a logic unit; and a light collection unit in which a plurality of photodiodes is formed, wherein the photodiodes are isolated from each other by a field ion-implantation region formed under a surface of a substrate and an insulation layer formed on the surface of the substrate.

15 Claims, 4 Drawing Sheets

U.S. PATENT DOCUMENTS

Figure 1:
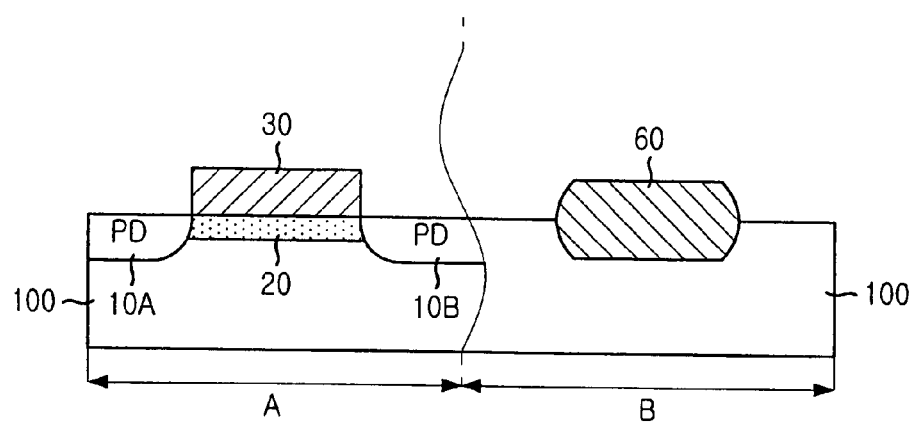

2004/0000681 A1* 1/2004 Shinohara et al. ........... 257/290
2004/0021194 A1* 2/2004 Mann ......................... 257/506
2005/0023553 A1* 2/2005 Rhodes ....................... 257/162

* cited by examiner

IMAGE SENSOR APPLIED WITH DEVICE ISOLATION TECHNIQUE FOR REDUCING DARK SIGNALS AND FABRICATION METHOD THEREOF

The present patent application is a Divisional of application Ser. No. 10/882,846, filed Jun. 30, 2004 now abandoned.

FIELD OF THE INVENTION

The present invention relates to an image sensor; and, more particularly, to an image sensor applied with a device isolation technique for reducing dark signals and a fabrication method thereof.

DESCRIPTION OF RELATED ARTS

As known, a device isolation technology has been employed to electrically isolate individual devices such as a transistor and a capacitor during fabrication of a semiconductor integration circuit. Among various techniques of the device isolation technology, a local oxidation of silicon (LOCOS) technique and a shallow trench isolation (STI) technique are commonly adopted.

The LOCOS technique is a method of forming a nitride layer-based mask pattern on an active region of a silicon substrate and thermally oxidating the silicon substrate with use of the mask pattern as a mask. However, the LOCOS technique has disadvantages that an oxide layer is formed in a wide area and a bird's beak phenomenon occurs at an interfacial surface between the oxide layer and the silicon substrate. Thus, it is limited to apply the LOCOS technique to highly integrated devices. As a result of this limitation, the STI technique is more widely employed in highly integrated devices since the STI technique forms a device isolation region by forming a shallow trench in a substrate and then burying an oxide layer into the trench.

Meanwhile, an image sensor is a semiconductor device that converts an optical image into an electric signal. Among various types of the image sensor, a charge coupled device (CCD) and a complementary metal oxide semiconductor (CMOS) image sensor are widely distributed. Such an image sensor has photodiodes within a unit pixel, and the photodiodes formed in neighboring unit pixels need to be individually isolated through the use of a device isolation layer.

The device isolation layer formed by a LOCOS technique or a STI technique for isolating each photodiode is impaired by numerous defects created by stress generated at a boundary region between a field region and an active region. These defects severely affect a dark characteristic, which is one of the most important characteristics of an image sensor. Therefore, it is strongly necessary to develop an effective device isolation technology applicable to a specific characteristic of an image sensor.

SUMMARY OF THE INVENTION

It is, therefore, an object of the present invention to provide an image sensor applied with a device isolation technique for reducing dark signals and a fabrication method thereof.

In accordance with an aspect of the present invention, there is provided an image sensor, including: a logic unit; and a light collection unit in which a plurality of photodiodes is formed, wherein the photodiodes are isolated from each other by a field ion-implantation region formed under a surface of a substrate and an insulation layer formed on the surface of the substrate.

In accordance with another aspect of the present invention, there is also provided a complementary metal oxide semiconductor (CMOS) image sensor, including: a logic unit; and a pixel array unit in which a plurality of photodiodes is formed, wherein the photodiodes are isolated from each other by a field ion-implantation region formed under a surface of a substrate and an insulation layer formed on the surface of the substrate.

In accordance with still another aspect of the present invention, there is also provided a method for forming a device isolation structure of an image sensor including a light collection unit and a logic unit, including the steps of: forming an insulation layer pattern on a substrate in a field region of the light collection unit; forming an insulation layer for device isolation in a field region of the logic unit by performing one of a LOCOS technique and a STI technique; and forming a field ion-implantation region under a surface of the substrate in the field region of the light collection unit.

BRIEF DESCRIPTION OF THE DRAWING(S)

Figure 2:
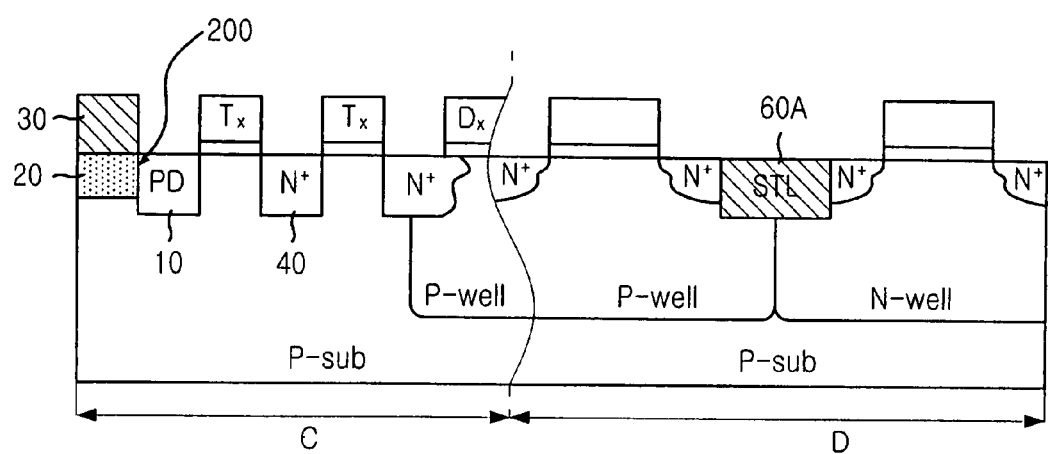

The above and other objects and features of the present invention will become apparent from the following description of the preferred embodiments given in conjunction with the accompanying drawings, in which:

FIG. 1 is a cross-sectional view showing a device isolation structure in an image sensor for reducing dark signals in accordance with a first preferred embodiment of the present invention;

FIG. 2 is a cross-sectional view showing a complementary semiconductor metal oxide semiconductor (CMOS) image sensor having a device isolation structure in accordance with a preferred embodiment of the present invention; and FIGS. 3A to 3F are cross-sectional views illustrating a method for forming a device isolation structure in an image sensor in accordance with the preferred embodiment of the present invention.

DETAILED DESCRIPTION OF THE INVENTION

Hereinafter, a preferred embodiment of the present invention will be described in detail with reference to the accompanying drawings.

FIG. 1 is a cross-sectional view showing a device isolation structure in an image sensor in accordance with a preferred embodiment of the present invention.

As shown, the image sensor is divided into a light collection unit A in which photodiodes are formed and a logic unit B in which typical complementary metal oxide semiconductor (CMOS) devices are formed. In the light collection unit A, there is a plurality of photodiodes 10A and 10B which generate photo-charges after collecting lights. Herein, the reference numbers 10A and 10B will be referred to as a first and a second photodiodes, respectively. A field ion-implantation region 20 is formed beneath a predetermined surface of a silicon substrate 100 disposed between the first photodiode 10A and the second photodiode 10B. An insulation layer 30 is formed on the predetermined surface of the silicon substrate 100. The field ion-implantation region 20 and the insulation layer 30 isolate the adjacently allocated first and second photodiodes 10A and 10B. If the silicon substrate 100 is a first conductive type, the first and the second photodiodes 10A and 10B are a second conductive type and the field ion-implantation region 20 is the first conductive type. Also, in the logic unit B, a conventional local oxidation of silicon (LOCOS) technique and/or a shallow trench isolation (STI) technique is performed to form an insulation layer 60, which is a device isolation layer.

As described above, in order to reduce dark signals of an image sensor, the light collection unit A is applied with a specialized device isolation technique, while the logic unit B is applied with the conventional LOCOS and/or STI technique. More specifically, the LOCOS technique and the STI technique are compulsorily accompanied with a thermal oxidation process. Thus, defects are created by stress generated at an interfacial surface between a field region and a device isolation region, thereby resulting in a problem of dark signals. However, in this preferred embodiment, generation of dark signals is reduced since the device isolation layer is formed by performing the ion-implantation process which does not require the thermal oxidation process and depositing the insulation layer.

FIG. 2 is a cross-sectional view showing a CMOS image sensor with a device isolation structure in accordance with the preferred embodiment of the present invention.

As shown, the CMOS image sensor is divided into a pixel array unit C in which photodiodes are formed and a logic unit D in which typical CMOS devices are formed. In the pixel array unit C, a photodiode 10 for generating photo-charges after collecting lights and a transfer gate Tx for transferring the photo-charges generated from the photodiode 10 to a sensing node 40 are formed. Also, a field ion-implantation region 20 and an insulation layer 30 isolate the devices in the pixel array unit C, while a device isolation layer 60A formed in the logic unit D by employing a STI technique or a LOCOS technique isolates the typical CMOS devices from each other. Hence, it is possible to reduce the number of defects generated at an interface 200 between a field region and an active region and further to reduce the number of dark signals.

Meanwhile, in consideration of process specifications such as ion-implantation energy, the insulation layer 30 for device isolation should have a predetermined thickness. That is, ion-implantation energy specified in a currently applied image sensor process is determined under consideration of a thickness of a device isolation layer formed by a LOCOS technique. Thus, the insulation layer 30 should be formed with a predetermined thickness identical to the thickness of a field oxide layer growing towards an upper surface of a silicon substrate through the use of a LOCOS technique in order not to change subsequent process conditions such as ion-implantation energy. Also, when the above specific device isolation structure is formed on the basis of the preferred embodiment, it is necessary to minimize changes in currently applied process conditions. Detailed descriptions on a method for forming the specific device isolation structure without changing the currently applied process conditions will be provided in the following.

FIGS. 3A to 3F are cross-sectional views illustrating a method for forming the device isolation structure in an image sensor in accordance with the preferred embodiment of the present invention.

Figure 3A:
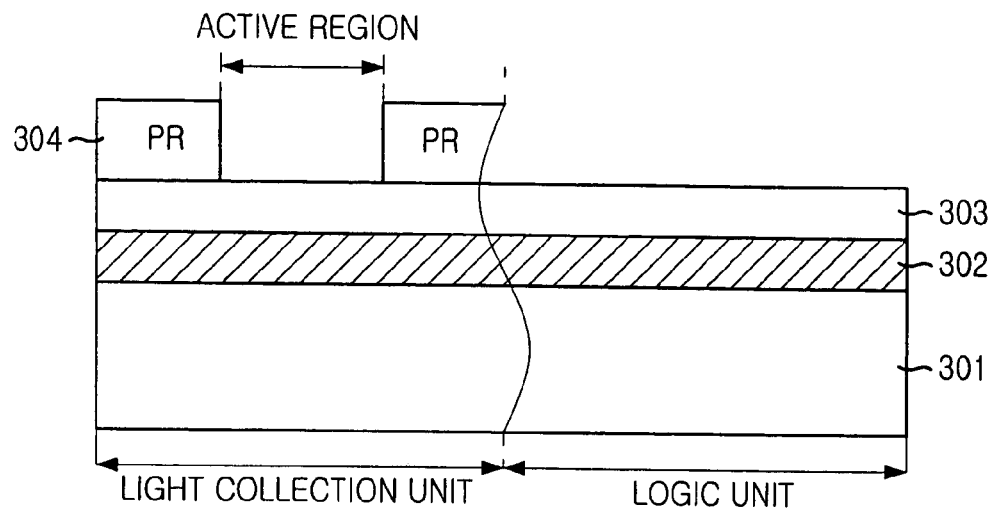

Referring to FIG. 3A, an oxide layer 302 and a nitride layer 303 are deposited on a silicon substrate 301. Herein, the oxide layer 302 is deposited to a thickness ranging from about 2000 Å to about 2500 Å, and the nitride layer 303 is deposited to a thickness ranging from about 1000 Å to about 1500 Å. A first device isolating mask pattern 304 for opening an active region of a light collection unit and an entire region of a logic unit is formed on the above resulting structure.

Specifically, the nitride layer 303 is a layer used to make sidewalls of a subsequently formed oxide layer pattern inclined. Also, the oxide layer 302 is grown through a thermal oxidation process, which makes impurities existing within the silicon substrate 301 diffused externally. As a result of this external diffusion, it is possible to obtain a gettering effect.

Also, the oxide layer 302, which will be used as the insulation layer 30 for device isolation as depicted in FIG. 1, should be sufficiently thick in consideration of subsequent processes, e.g., an ion-implantation process. For instance, since a typical thickness of a field oxide layer grown towards an upper surface of a silicon substrate by employing a LOCOS technique is about 2200 Å, it is required to form the oxide layer 302 at least with such thickness. The first device isolating mask pattern 304 is a photoresist PR formed by a conventional photolithography process.

Figure 3B:
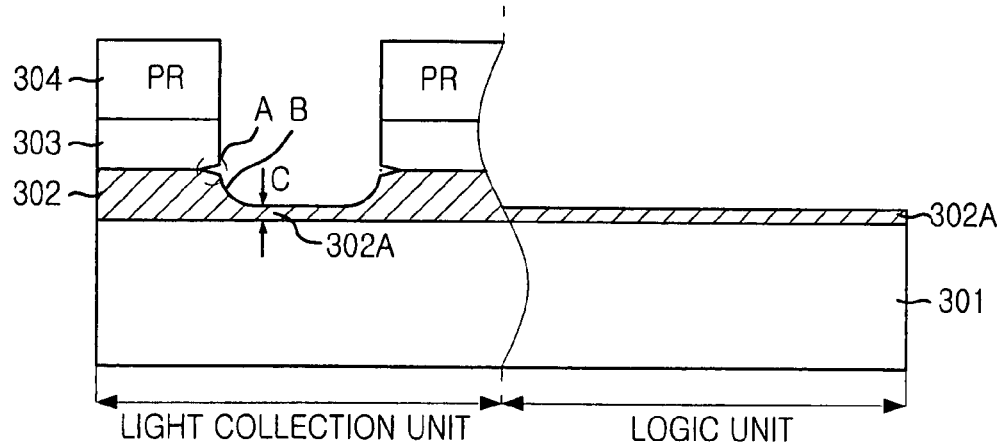
Figure 3C:
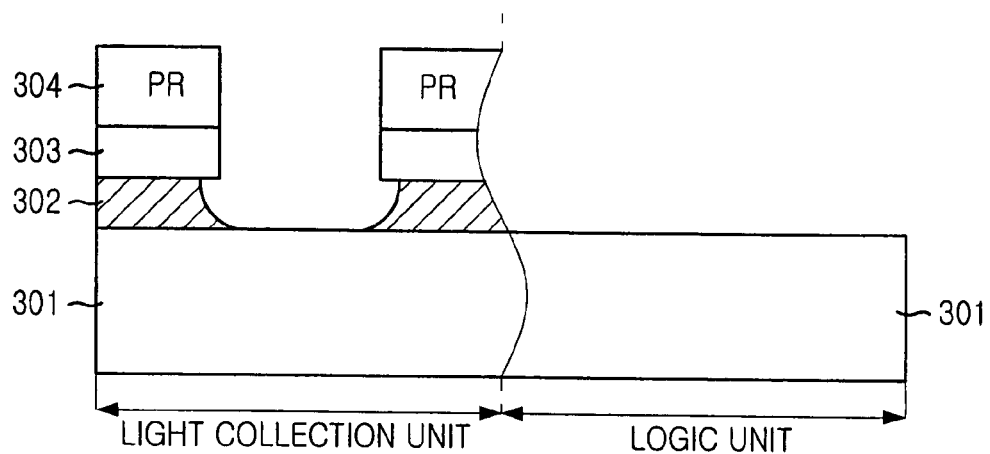

FIGS. 3B and 3C are cross-sectional views showing an etched state of the nitride layer 303 and the oxide layer 302 in the opened active region by using the first device isolating mask pattern 304. Particularly, FIG. 3B is a cross-sectional view showing the etched state of the nitride layer 303 and the oxide layer 302 after a dry etching process. On the other hand, FIG. 3C is a cross-sectional view showing the etched state of the nitride layer 303 and the oxide layer 302 after a wet etching process.

Preferably, the dry etching process is performed such that a lateral profile of the oxide layer 302 is patterned to have an inclination in an angle of about 60°, which is denoted as the reference symbol B in FIG. 3B. The reason for this inclination is to prevent generation of remnants in a conductive layer, e.g., a polysilicon layer for use in a gate electrode. Also, it is preferable to form an undercut, denoted as the reference symbol A, at a bottom portion of each sidewall of the nitride layer 303 patterned by the dry etching process. The reason for forming the undercut is to round an upper part of the oxide layer 302 during the subsequent wet etching process. In addition, during the dry etching process, the oxide layer 302 is made to remain in a thickness ranging from about 600 Å to about 700 Å in order to prevent the silicon substrate 301 from being damaged by a plasma used during the dry etching process. This remaining oxide layer 302 is denoted as the reference symbol C in FIG. 3B.

Figure 3D:
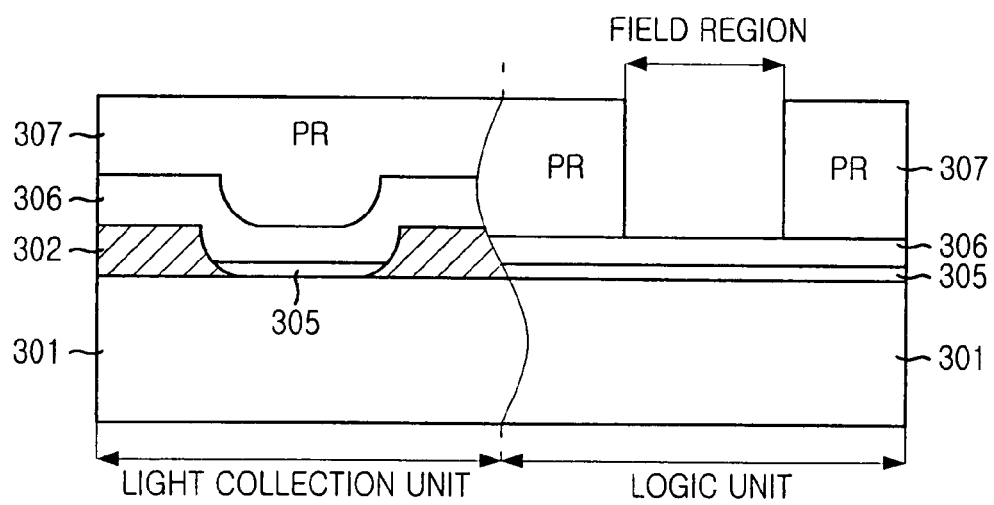

With reference to FIG. 3D, the first device isolating mask pattern 304 and the nitride layer 303 are removed. Then, a pad oxide layer 305 and a pad nitride layer 306 are deposited for device isolation in the logic unit. At this time, the pad oxide layer 305 has a thickness ranging from about 100 Å to about 200 Å, while the pad nitride layer 306 has a thickness ranging from about 1000 Å to about 1500 Å. Thereafter, a second device isolating mask pattern 307 opening a field region in the logic unit is formed on the above resulting structure.

Figure 3E:
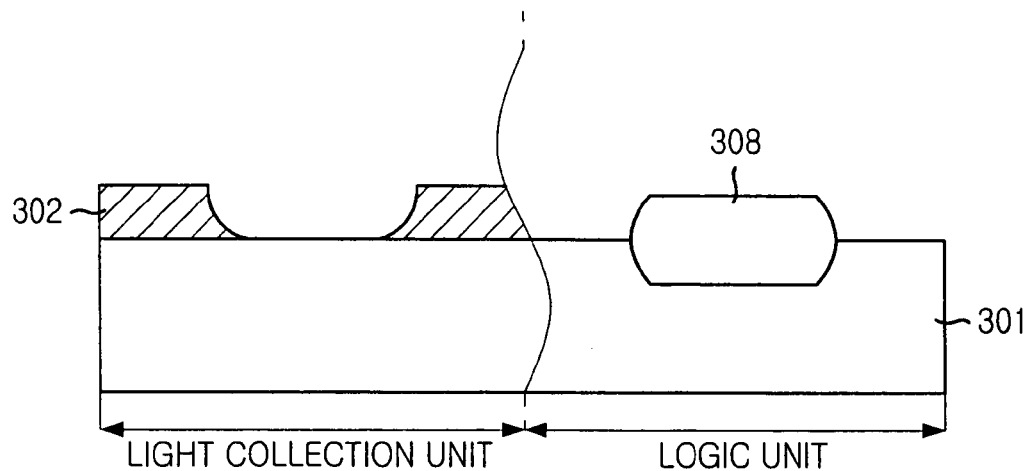

Referring to FIG. 3E, the second device isolating mask pattern 307 is removed, and a field insulation layer 308 is grown in the logic unit by performing a thermal process. The pad nitride layer 306 and the pad oxide layer 305 are removed thereafter.

FIGS. 3D and 3E disclose the steps of forming the device isolation layer in the field region of the logic unit by employing the conventional LOCOS technique. However, in addition to the LOCOS technique, it is still possible to form the device isolation layer in the logic unit by a conventional STI technique.

Figure 3F:
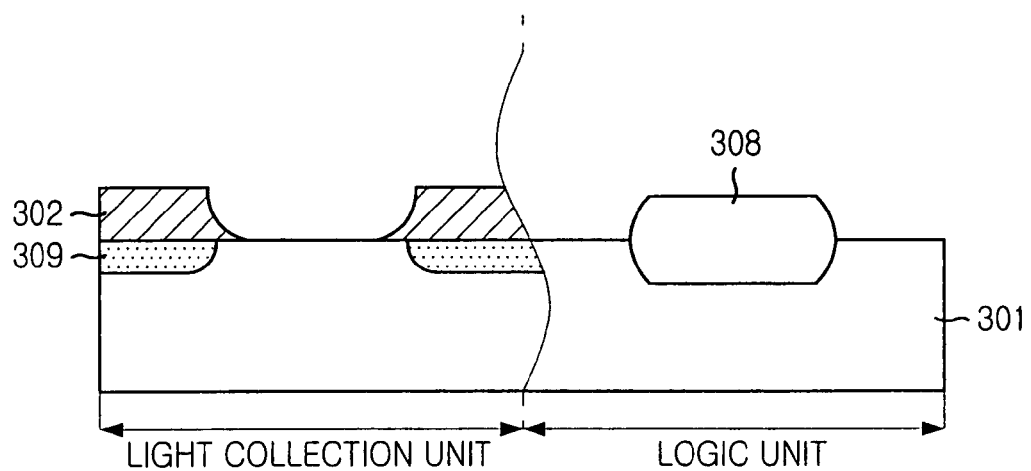

Referring to FIG. 3F, a selective ion-implantation process is performed only to the field region in which the oxide layer 302 remains in the light collection unit. From the selective ion-implantation process, a field ion-implantation region 309 is formed under a surface of the silicon substrate 301 disposed below the oxide layer 302 in the light collection unit.

On the basis of the preferred embodiment of the present invention, the light collection unit is applied with a specialized device isolation technique for forming the field ion-implantation region and the oxide layer. On the contrary, the logic unit is applied with the conventional LOCOS and/or STI technique. As a result, it is possible to prevent defect generations caused by stress in the light collection unit, thereby reducing dark signals. Therefore, it is further possible to improve a low light level characteristic of an image sensor and increase yields. Moreover, since the device isolation structure can be obtained with minimum changes in the conventionally employed processes, there is an additional effect of shortening periods and reducing costs for development and mass-production of image sensors.

The present application contains subject matter related to the Korean patent application No. KR 2003-0091843, filed in the Korean Patent Office on Dec. 16, 2003, the entire contents of which being incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A method for forming a device isolation structure in an image sensor including a light collection unity and a logic unit, comprising the steps of:
    forming an insulation layer pattern on a substrate in a field region of the light collection unit;
    forming an insulation layer for device isolation in a field region of the logic unit by performing one of a LOCOS technique and a STI technique; and
    forming a field ion-implantation region under a surface of the substrate in the field region of the light collection unit.

2. The method as recited in claim 1, wherein the insulation layer pattern is formed in a manner to have inclined sidewalls.

3. The method as recited in claim 1, wherein the step of forming the insulation layer pattern includes the steps of:
    stacking an oxide layer and a nitride layer on a substrate;
    forming a mask pattern on the nitride layer, the mask pattern opening an active region of the light collection unit;
    performing a dry etching process and a subsequent wet etching process to the nitride layer and the oxide layer by using the mask pattern as an etch mask; and
    removing the mask pattern and the nitride layer.

4. The method as recited in claim 1, wherein an undercut is formed at a bottom portion of each sidewall of the nitride layer patterned by the dry etching process.

5. The method as recited in claim 1, wherein the oxide layer is made to remain in a thickness ranging from about 600.ANG. to about 700.ANG. during the dry etching process.

6. The method as recited in claim 3, wherein the oxide layer is grown by a thermal process.

7. A method for fabricating a complementary metal oxide semiconductor (CMOS) image sensor, comprising:
    dividing a substrate into a logic unit and a pixel array unit;
    forming an oxide layer on the substrate divided into both the logic unit and the pixel array unit, wherein the oxide layer has different thickness based on which one of the logic unit and the pixel array unit the oxide layer is formed on;
    forming an ion-implantation region under the oxide layer in the pixel array unit; and
    forming an insulation layer in the logic unit.

8. The method as recited in claim 7, wherein the forming the oxide layer includes:
    forming the oxide layer on the logic unit and the pixel array unit;
    forming a nitride layer on the oxide layer;
    forming a first isolation mask pattern only on the nitride layer formed over the pixel array unit;
    etching the oxide layer and the nitride layer in response to the first isolation mask pattern; and
    removing the isolation mask pattern and remained nitride layer.

9. The method as recited in claim 7, wherein the ion-implantation region is formed by a selective ion-implantation process.

10. The method as recited in claim 9, wherein the pixel array unit includes a plurality of photodiodes which are isolated from each other by a field ion-implantation region.

11. The method as recited in claim 9, wherein the substrate and the field ion-implantation region are formed of a first conductive type and the photodiode is formed of a second conductive type.

12. The method as recited in claim 7, wherein the forming the insulation layer includes:
    forming a pad oxide layer in the logic unit;
    forming a pad nitride layer on the pad oxide layer;
    forming a second isolation pattern mask on the pad nitride layer;
    performing a thermal process by using the second isolation pattern mask to form the insulation layer; and
    removing remained pad oxide layer and remained pad nitride layer.

13. The method as recited in claim 12, wherein the logic unit includes the insulation layer for device isolation formed by one of a LOCOS technique and a STI technique.

14. The method as recited in claim 7, wherein the insulation layer is an oxide layer grown by a thermal process.

15. The method as recited in claim 14, wherein the insulation layer is formed with a predetermined thickness in consideration of ion-implantation energy used in a subsequent ion-implantation process.

* * * * *

UNITED STATES PATENT AND TRADEMARK OFFICE
CERTIFICATE OF CORRECTION

PATENT NO. : 7,507,614 B2
APPLICATION NO. : 11/890991
DATED : March 24, 2009
INVENTOR(S) : Jae-Young Rim et al.

It is certified that error appears in the above-identified patent and that said Letters Patent is hereby corrected as shown below:

Column 5, line 21, delete "unity" and insert --unit--.

Signed and Sealed this

Eighteenth Day of May, 2010

David J. Kappos
*Director of the United States Patent and Trademark Office*